US010601158B2

(12) United States Patent
Kajiwara et al.

(10) Patent No.: US 10,601,158 B2
(45) Date of Patent: Mar. 24, 2020

(54) VEHICLE-MOUNTED ELECTRONIC MODULE, CARD EDGE CONNECTOR, AND CONNECTOR

(71) Applicant: Hitachi Automotive Systems, Ltd., Hitachinaka-shi, Ibaraki (JP)

(72) Inventors: Ryouichi Kajiwara, Tokyo (JP); Toshiaki Ishii, Tokyo (JP); Masaru Kamoshida, Hitachinaka (JP)

(73) Assignee: Hitachi Automotive Systems, Ltd., Hitachinaka-shi, Ibaraki (JP)

( * ) Notice: Subject to any disclaimer, the term of this patent is extended or adjusted under 35 U.S.C. 154(b) by 0 days.

(21) Appl. No.: 16/070,660

(22) PCT Filed: Dec. 22, 2016

(86) PCT No.: PCT/JP2016/088264
§ 371 (c)(1),
(2) Date: Jul. 17, 2018

(87) PCT Pub. No.: WO2017/126283
PCT Pub. Date: Jul. 27, 2017

(65) Prior Publication Data
US 2019/0027848 A1    Jan. 24, 2019

(30) Foreign Application Priority Data

Jan. 22, 2016  (JP) .................................. 2016-010227

(51) Int. Cl.
*H01R 12/72*          (2011.01)
*H01R 13/03*          (2006.01)
(Continued)

(52) U.S. Cl.
CPC ............. *H01R 12/72* (2013.01); *H01R 13/03* (2013.01); *H05K 1/09* (2013.01); *H05K 1/11* (2013.01);
(Continued)

(58) Field of Classification Search
CPC ......... H01R 12/72; H01R 13/03; H05K 1/117
See application file for complete search history.

(56) References Cited

U.S. PATENT DOCUMENTS 9,680,246 B2 *  6/2017  Takahashi ................ C25D 3/12
9,755,343 B2 *  9/2017  Sunaga ................. C23C 28/023
(Continued)

FOREIGN PATENT DOCUMENTS

JP    H10-247766 A    9/1998
JP    2003-068966 A   3/2003
(Continued)

OTHER PUBLICATIONS

International Search Report with English translation and Written Opinion issued in corresponding application No. PCT/JP2016/088264 dated Mar. 28, 2017.

*Primary Examiner* — William H. Mayo, III
*Assistant Examiner* — Hiram E Gonzalez
(74) *Attorney, Agent, or Firm* — Foley & Lardner LLP

(57) ABSTRACT

There is a problem that an oxide film or high resistance abrasion powder is formed at the contact interface due to micro sliding abrasion in a high temperature environment or temperature cycle to increase the contact resistance at the contact portion of a non-noble metal connection terminal. Provided is an in-vehicle electronic module, a connector, and a connection structure thereof, which have the same connection reliability as noble metals even when exposed to a harsh environment and can reduce cost of members.
The in-vehicle electronic module includes a circuit board on which an electronic component is mounted, and a protection member accommodating the circuit board and protecting the circuit board from a surrounding environment and has a structure where a surface layer at an end portion of the circuit board is made of an 1 Ag-containing Sn-based solder having average thickness of 4 μm or more, and a surface (Continued)

material of a connection terminal of one card edge connector has a two layer structure of a soft noble metal layer of Ag, Pd, Pt, or the like/a reaction layer of a hard noble metal and Sn or an Ni layer.

3 Claims, 5 Drawing Sheets

(51) Int. Cl.
*H05K 1/11* (2006.01)
*H05K 1/09* (2006.01)
*H05K 3/40* (2006.01)
*H05K 3/34* (2006.01)

(52) U.S. Cl.
CPC ........... *H05K 1/117* (2013.01); *H05K 3/3463* (2013.01); *H05K 3/4007* (2013.01); *H05K 2201/0338* (2013.01); *H05K 2201/10371* (2013.01)

(56) References Cited

U.S. PATENT DOCUMENTS

| | | | |
|---|---|---|---|
| 2011/0036621 A1* | 2/2011 | Kobayashi | C23C 2/28 174/257 |
| 2015/0259813 A1 | 9/2015 | Kodama et al. | |
| 2015/0310956 A1 | 10/2015 | Schmidt | |
| 2015/0340784 A1* | 11/2015 | Moriyasu | H01R 12/721 439/630 |
| 2016/0285186 A1* | 9/2016 | Oda | H01R 13/03 |
| 2016/0309600 A1 | 10/2016 | Kajiwara et al. | |

FOREIGN PATENT DOCUMENTS

| | | |
|---|---|---|
| JP | 2006-009126 A | 1/2006 |
| JP | 2013-143202 A | 7/2013 |
| JP | 2014-139345 A | 7/2014 |
| JP | 2015-045042 A | 3/2015 |
| JP | 2015-125951 A | 7/2015 |
| JP | 2015-222715 A | 12/2015 |

* cited by examiner

CROSS SECTION ALONG LINE A-A' OF FIG. 1

FIG. 6

| | METALLIZATION OF CONNECTOR TERMINAL | | | | METALLIZATION OF BOARD CONNECTION TERMINAL | | | CONNECTION RELIABILITY | | BOARD COST | EVALUATION |
|---|---|---|---|---|---|---|---|---|---|---|---|
| | MATERIAL OF SURFACE LAYER | | THICKNESS (μm) | HARDNESS (Hv) | SURFACE LAYER | | BASE MATERIAL | HIGH TEMPERATURE EXPOSURE | TEMPERATURE CYCLE | | |
| | FIRST LAYER (SURFACE) | SECOND LAYER | FIRST+ SECOND LAYER | FIRST LAYER/ SECOND LAYER | MATERIAL | THICKNESS (μm) | | | | | |
| 1 | Ag | Ag-Sn COMPOUND | 2.0 | 60/300 | Sn-Zn SOLDER | 6.0 | Cu | × | × | ○ | × |
| 2 | | | 2.0 | | Sn-Cu SOLDER | 6.0 | | △ | △ | ○ | △ |
| 3 | | | 2.0 | | 1 Ag-Sn BASED SOLDER | 1.0 | | × | × | ○ | × |
| 4 | | | 0.2 | | | 4.0 | | × | × | ○ | × |
| 5 | | | 1.0 | | | 4.0 | | ○ | ○ | ○ | ○ |
| 6 | | | 2.0 | | 3 Ag-Sn BASED SOLDER | 1.0 | | × | × | ○ | × |
| 7 | | | 2.0 | | | 2.0 | | △ | △ | ○ | △ |
| 8 | | | 1.0 | | | 4.0 | | ○ | ○ | ○ | ○ |
| 9 | | | 1.0 | | | 8.0 | | ○ | ○ | ○ | ○ |
| 10 | | | 2.0 | | | 10.0 | | ○ | ○ | ○ | ○ |
| 11 | | | 1.0 | | 8 Ag-Sn BASED SOLDER | 2.0 | | △ | △ | ○ | △ |
| 12 | | | 1.0 | | | 4.0 | | ○ | ○ | ○ | ○ |
| 13 | | | 1.0 | | | 10.0 | | ○ | ○ | ○ | ○ |
| 14 | | | 1.0 | | 20 Ag-Sn BASED SOLDER | 2.0 | | ○ | ○ | △ | △ |
| 15 | | | 1.0 | | | 4.0 | | ○ | ○ | △ | △ |

FIG. 7

| | METALLIZATION OF CONNECTOR TERMINAL | | | | METALLIZATION OF BOARD CONNECTION TERMINAL | | | CONNECTION RELIABILITY | | BOARD COST | EVALUATION |
|---|---|---|---|---|---|---|---|---|---|---|---|
| | SURFACE FIRST LAYER | | MATERIAL OF SECOND LAYER | HARDNESS (Hv) | SURFACE LAYER | | BASE MATERIAL | HIGH TEMPERATURE EXPOSURE | TEMPERATURE CYCLE | | |
| | MATERIAL | THICKNESS (μm) | | FIRST LAYER/ SECOND LAYER | MATERIAL | THICKNESS (μm) | | | | | |
| 16 | Ag | 0.2 | Ni | 60/130 | 3 Ag-Sn BASED SOLDER | 4.0 | Cu | △ | △ | ○ | △ |
| 17 | | 2.0 | | | | 2.0 | | △ | △ | ○ | △ |
| 18 | | 1.0 | | | | 4.0 | | ○ | ○ | ○ | ○ |
| 19 | | | | | | 10.0 | | ○ | ○ | ○ | ○ |
| 20 | Ag | 0.5 | Ni | 60/130 | Ag | 1.0 | Cu | ○ | ○ | △ | △ |
| 21 | Au | 0.2 | Ni | 40/600 | Au | 0.2 | Ni | ○ | ○ | × | × |

VEHICLE-MOUNTED ELECTRONIC MODULE, CARD EDGE CONNECTOR, AND CONNECTOR

TECHNICAL FIELD

The present invention relates to an in-vehicle electronic module including a circuit board on which an electronic component is mounted, a protection member made of a resin and a metal for shielding and protecting the circuit board from outside air, and a board terminal exposed from the protection member and electrically connected to an external electric circuit, a card edge connector connected to the board terminal, and a connection structure thereof.

BACKGROUND ART

As background technology in this technical field, there is JP 2013-143202 A (PTL 1). PTL 1 describes an electronic device including a circuit board on which an electronic component is mounted and a casing accommodating the circuit board, in which the casing has a structure including a connector accommodating space accommodating and fixing a card edge connector connecting a board connection terminal of the circuit board and an external wiring harness and a board accommodating space, and an end portion where a board connection terminal of the circuit board is formed protrudes from the board accommodating space into the connector accommodating space to be inserted into a board insertion space of the card edge connector, so that the connector terminal and the board connection terminal are contact-connected by a spring mechanism of the connector side. There is described a mechanism that does not cause a relative misalignment or the like between the circuit board and the card edge connector even in a case where vibration or an external force acting on the electronic device is applied. With respect to the material of the connector terminal, there is described a case where Ni/Au is plated on phosphor bronze. However, with respect to the material of the board connection terminal, there is no description.

On the other hand, a material of a board connection terminal of a circuit board connected by a card edge connector is disclosed in JP 2006-9126 A (PTL 2). PTL 2 describes an FPC board where a lead-free solder plating layer having a thickness of 0.2 to 2.0 µm is formed in a wiring circuit of a connector fitting portion of the FPC board, a lead-free solder plating layer having a thickness of 2.0 µm or more is formed in a wiring circuit of a component mounting portion of the FPC board in order to prevent deterioration in wettability by the growth of a Cu—Sn intermetallic compound, and heat treatment is performed under a condition that the lead-free solder plating layer is heated at 140 to 180° C. for 1 hour or at a temperature of a solder melting point or more for 0.1 second or more. There is described an effect that, in the connector fitting portion of the FPC board, it is possible to suppress whiskers growing from the portion where the connector terminal is brought into contact.

In addition, a surface treatment plating material of a contact terminal is disclosed in JP 2014-139345 A (PTL 3). PTL 3 describes a structure where a lower layer made of Ni or an Ni alloy is formed on a metal base and an upper layer made of an alloy plating containing Sn are sequentially formed. As an alloy of the upper layer, an alloy configured with Sn or Sn+In and one or two or more types selected from a constituent element group including Ag, Au, Pd, Pt, Ru, Rh, Os, and Ir are described. There is a description in that the thickness of the alloy layer containing Sn is selected in the range of 0.02 to 0.5 µm, and a solution containing P is used for the surface treatment, so that it is possible to suppress occurrence of whiskers, to obtain wettability of solder after high temperature exposure, a low contact resistance, and a low insertion force of the connector.

In addition, JP 2015-45042 A (PTL 4) discloses a structure including a lower layer made of one or two or more types selected from a constituent element group A including Ni, Cr, Mn, Fe, Co, and Cu, an upper layer made of one or two types selected from a constituent element group B including Sn and In and one or two or more types selected from a constituent element group C including Ag, Au, Pd, Pt, Ru, Rh, Os, and Ir and having a thickness of 0.02 µm or more and less than 1.0 µm, and an intermediate layer made of one or two or more types selected from the constituent element group A and one or two types selected from the constituent element group B and having a thickness of 0.01 µm or more and less than 0.4 µm or an intermediate layer made of one or two or more types selected from the constituent element group C and having a thickness of 0.01 µm or more and less than 0.4 µm, in which the lower layer, the intermediate layer, and the upper layer are formed on a base material in this order, and in which a treatment layer including one or more types selected from a group including O, C, S, P, and N is formed on the upper layer. It is described that it is possible to provide a metal material for an electronic component having a low whisker property, a low adhesion abrasion (low insertion/extraction property), a strong durability even under a corrosive environment, and thus, applications to a connector terminal or an FFC or FPC terminal is described.

CITATION LIST

Patent Literature

PTL 1: JP 2013-143202 A
PTL 2: JP 2006-9126 A
PTL 3: JP 2014-139345 A
PTL 4: JP 2015-45042 A

SUMMARY OF INVENTION

Technical Problem

The card edge connector is a connector for obtaining electrical conduction by inserting the end portion of the circuit board of the electronic module into the board insertion space of the female connector, sandwiching the connection terminal of the board by the connector terminal having the spring mechanism incorporated in the female connector, and allowing both terminals to be in mechanical contact with each other.

In order to obtain stable electrical conduction for a long period of time with this card edge connector, it is important 1) to maintain a contact pressure for a long period of time, 2) to suppress sliding abrasion on the contact interface, and 3) to suppress contamination of a high electric resistance foreign matter and formation of a high electric resistance film. At the same time, for the in-vehicle electronic module and the connector components used for connection thereof, reduction of the cost is an important issue, and demetallization of the circuit boards and the connector components is required.

In PTL 1, in the structure of the card edge connector in which the wire line of the end portion of the circuit board is inserted as the connection terminal into the female connector to obtain the electrical connection, a mechanism for preventing rattling accompanying a tolerance when the connector housing is attached to the casing accommodating the circuit board is provided to suppress the relative movement between the connector and the circuit board, and thus, solution to the problem of increase in resistance due to 2) sliding abrasion is provided. It is certainly possible to prevent peeling of the plating layer caused by a large sliding motion such as structural rattling or short circuit failure due to peeled plating debris. However, micro sliding abrasion caused by thermal expansion difference involved with temperature fluctuation cannot be prevented even if the connector and the circuit board are fixed. In PTL 1, Ni/Au plating is exemplified as the material of the contact surface, and it is described that, in this case, long-term reliability can be obtained. However, the Ni/Au plating on the wire line of the connector terminals and the circuit board is expensive, and there is no consideration of cost reduction of the members. There is also no description about long-term reliability in the case of being used under a harsh environment such as inside an engine room of a car, or means or method for obtaining long-term reliability with materials other than Ni/Au.

In addition, PTL 2 describes that, the lead-free solder plating is selected as the surface treatment for reducing the contact resistance between the connector and the wire line so as to eliminate defects of electrical conduction and to reduce the cost, and thin lead-free solder plating on the FPC terminal with a thickness of 0.5 to 2.0 µm is performed to prevent corrosion and to suppress occurrence of whiskers in the connector fitting portion, and a lead-free solder plating layer having a thickness of 2.0 µm or more is formed in the wiring circuit of the component mounting portion to secure solder wettability. However, in the configuration of PTL 2, with respect to the long-term connection reliability under the harsh environment of the connector fitting portion, there is not described a problem in that, resistance is increased due to growth of the intermetallic compounds at high temperature and surface oxidation, and resistance is increased due to the thinning of the plating layer caused by micro sliding abrasion accompanying temperature cycles and the appearance of the base material. For terminals on which thin lead-free solder plating with a thickness of 0.5 to 2.0 µm is performed, contact resistance of contact points is set to a small value of, for example, 10 mΩ or less under a temperature cycle environment of high temperature, high temperature and high humidity, or large temperature difference like inside the engine room of a car for a long period of time. In addition, the formation of a lead-free solder film by plating causes a problem in that the cost of managing a plating solution and a waste solution is expensive and the process cost cannot be reduced.

In addition, PTL 3 describes that, after forming an alloy layer with a noble metal containing Sn having a thickness of 0.02 to 0.5 µm on the surface layer, a surface treatment with a liquid containing P is performed to suppress the occurrence of whiskers and to secure solder wettability and a low contact resistance and a low insertion force of a connector can be obtained, and describes that it can be used for both of the male terminal and the female terminal of the connector, or it can be used for only one side thereof. However, in the case of being used only for one side, there is no description about the material of the other party. According to the inventors' study, it is found that, in a case where the opposite side of the connector is used as the connection terminal of the circuit board and the Cu wire line as the metallization of the connection terminal is coated with inexpensive Sn-based solder, Cu appears on the surface of the connection terminal, and thus, there is a problem in that the contact resistance is increased under the long-term high temperature environment and the temperature cycle environment of the present invention. In addition, in PTL 3, the reliability evaluation of the contact resistance is performed in a loose standard at 155° C. for 16 hours with less than 10 mΩ or at 100 cycles of micro sliding abrasion with 100 mΩ or less, but in vehicle applications, the reliability for a much longer period of time is required, so that the material composition of PTL 3 results in insufficient reliability.

In PTL 4, the thickness of the alloy layer with the noble metal containing Sn in the upper layer is described as a thickness of 0.02 to 1.0 µm, the noble metal layer having a thickness of 0.01 to 0.4 µm is described as the middle layer, and the metal layer of Ni or the like is described as the lower layer. However, the use is similar to that of PTL 3, and in the cased of being used as a card edge connector of an in-vehicle electronic module, the same problem as the PTL 3 occurs with respect to reliability. In addition, in the cased where the connector terminal is manufactured by press-forming from a copper strip where the metallized layer is formed, since the alloy of Sn and the noble metal in the upper layer is hard, a large number of crack defects are generated on the surface of the convex-shaped contact portion, and thus, there is a problem that long-term reliability cannot be obtained. If metallization is performed on the connector terminal after press-forming, there is no problem of crack defects, but there is a problem of high manufacturing cost.

With respect to reliability required for the connector connection portion of the in-vehicle electronic module, high temperature exposure resistance, high temperature/high humidity resistance, temperature cycle resistance, mechanical vibration resistance, resistance in a complicated environment as a combination thereof, resistance in an environment accompanying electrical operation, or the contact electric resistance of the connection portion is not greatly increased even in the case of being placed under various types of harsh environments. At the same time, another problem required for the in-vehicle electronic module is how to reduce the cost of members to be used and the manufacturing process.

An object of the present invention is to provide an in-vehicle electronic module, a card edge connector, and a connection structure thereof being inexpensive and having high electrical connection reliability without performing expensive Au plating on a circuit board and a connector components and without a great increase in electrical resistance of a connector connection portion even being placed under a harsh environment such as the engine room for a long period of time.

Solution to Problem

It is found by the inventors as the results of evaluation of long-term reliability is performed on samples in which the configuration of the metallization of the board-side connection terminal and the configuration of the metallization of the female connector terminal are variously changed that high reliability can be obtained even under a harsh environment required for a vehicle field if one terminal surface is configured as a soft noble metal surface of Ag or the like and a low melting point alloy layer using Sn as a main component and containing Ag and not forming a brittle intermetallic compound with the noble metal facing the other terminal surface is formed with a predetermined thickness. In addition, it is found that, in a case where one terminal surface is made of a noble metal such as Au, even if the other terminal surface is a low melting point alloy layer using Sn as a main component and containing Ag, a brittle Au—Sn intermetallic compound is formed under a use environment of a car, the contact resistance is increased. In addition, it is found that, in a case where a low melting point alloy layer using Sn as a main component and containing Ag is formed as thin as about 1 μm on Cu, even if the other terminal surface is made of a noble metal such as Ag, the Cu—Sn intermetallic compound appears at an early stage, and thus, an increase in resistance begins in a relatively short period of time. That is, it is found that the combination of the metal types on the surfaces that are in contact with each other and the thickness of the layer of the metal types greatly affect long-term reliability. In the related art, there is known a combination of Ni/Au plating and Ag plating to provide high reliability, but it is expensive. However, it is found that, if one terminal surface is made of inexpensive Sn-based low melting point alloy, an increase in cost can be suppressed and sufficient reliability can be obtained.

The in-vehicle electronic module according to the present invention completed on the basis of the above-described findings includes a circuit board on which an electronic component is mounted, a box-shaped casing having a metal member accommodating the circuit board to protect the circuit board from the surrounding environment and an internal space or a protection member of a molded resin integrally with the metal member, an end portion of the circuit board protruding from the circuit board accommodating region of the protection member into an external space, and a connection terminal inserting the end portion of the board into the female connector to obtain electrical connection on a surface of the end portion of the board; the connection terminal has a structure where a solder layer using Sn as a main component and containing Ag with an average thickness of 4 μm or more is formed on the outermost surface of the Cu wire line; a card edge connector fitting the end portion of the board to obtain electrical connection is configured by forming a core material of the connector connection terminal with a Cu alloy having an excellent spring characteristic and has a multi-layer structure formed with the outermost surface of the contact portion which configured with a first metal layer selected from Ag, Pd, and Pt, a second metal layer made of one or more metals selected from Au, Ag, Pd, and Pt and Sn as the underlying layer, and one or two intermediate layers as the underlying layer; and the connector has a structure where a hardness of the first metal layer of the contact portion is set to be less than 100 Hv and a hardness of the second metal layer as the underlying layer is set to be 100 Hv or more; and the connector structure is connected by the configuration of the metallization.

In another configuration of the in-vehicle electronic module according to the present invention, the surface layer of the Cu wire line at the end portion of the circuit board protruding into the external space has a structure where an Ag—Sn intermetallic compound having a grain size of 1 μm or more is dispersed in the Sn-based solder layer or a structure where an Ag—Sn intermetallic compound is formed in a layer form on a surface of the Sn-based solder layer.

In another configuration of the card edge connector according to the present invention, the core material of the connector connection terminal is configured with a Cu alloy having an excellent spring characteristic, and the metallization of the outermost layer of the contact portion has a structure where a first metal layer selected from among Ag, Pd, and Pt and having a thickness of 1.0 μm or more and a second metal layer made of Ni or an Ni alloy having a thickness of 1.0 μm or more as the underlying layer are formed, and a hardness of the first metal layer of the contact portion is set to be less than 100 Hv, and a hardness of the second metal layer as the underlying layer is set to be 100 Hv or more.

In addition, another in-vehicle electronic module according to the present invention includes a circuit board on which an electronic component is mounted, a box-shaped casing having a metal member accommodating the circuit board to protect the circuit board from the surrounding environment and an internal space or a protection member of a molded resin integrally with the metal member, an end portion of the circuit board protruding from the circuit board accommodating region of the protection member into an external space, and a connection terminal inserting the end portion of the board into the female connector to obtain electrical connection on a surface of the end portion of the board; the connection terminal has a structure where a first metal layer made of a metal selected from a group including Ag, Pd, and Pt on the outermost surface of the Cu wire line, a second metal layer made of a metal selected from a group of Ag, Pd, Pt, and Au and Sn, and one or two intermediate layers as the underlying layer are formed as a layer configuration and a total average thickness of the first and second metal layers is set to 1 μm or more; a card edge connector fitting the end portion of the board to obtain electrical connection is configured by using a core material of the connector connection terminal with a Cu alloy having an excellent spring characteristic, and metallization of the outermost layer of the contact portion is configured with an Sn-based solder layer by using Sn as a main component and containing Ag and having a thickness of 4.0 μm or more, and the structure is connected in this configuration of the metallization.

In another configuration of the card edge connector, the core material of the connector connection terminal is formed with a Cu alloy having an excellent spring characteristic, the metallization of the outermost layer of the contact portion has a structure where a first metal layer made of an Sn-based solder using Sn as a main component and containing Ag and having a thickness of 2.0 μm and a second metal layer made of Ni or an Ni alloy having a thickness of 1.0 μm or more as the underlying layer are formed, and a hardness of the second metal layer of the contact portion is set to 100 Hv or more.

The configuration of the metallization of the connection terminal at the end portion of the circuit board is a Cu wire line/an Ag-containing Sn-based solder with a thickness of 4.0 μm or more, the configuration of the metallization of the connector terminal is a Cu base material/Ni plating/Sn—Ag/Ag. In a case where the two confirmations of the metallization is connected in a state of being pressed, the Sn-based solder layer of the board-side connection terminal is thinned due to creep deformation under the high temperature environment, and at the same time, Cu diffuses and penetrates into the Sn-based solder to allow a Cu—Sn intermetallic compound to be grown from the Cu side. Although Ag in the solder is precipitated as an Ag—Sn intermetallic compound, since the Ag is partially formed and the matrix is made of Sn, Cu—Sn intermetallic compound is grown up to the outermost surface of the connection terminal according to temperature and time. However, when the outermost surface of the connector terminal is made of Ag, the Ag of the connector terminal diffuses into the Sn-based solder of the board-side connection terminal at the contact portion to form the Ag—Sn intermetallic compound in the surface layer and to prevent the Cu—Sn intermetallic compound grown from the bottom from being exposed to the surface, and thus, the contact interface between Ag and Ag—Sn intermetallic compound is maintained for a long period of time, so that low contact resistance can be maintained. When the outermost surface of the connector terminal is made of an Ag—Sn intermetallic compound, the formation rate at which the Ag—Sn intermetallic compound is formed on the surface of the board-side connection terminal is slow, and the Cu—Sn intermetallic compound is exposed also at the contact interface on the board side. Therefore, when the predetermined period has elapsed in the oxidation of Cu, the contact resistance is increased.

If the thickness of the Sn-based solder layer of the board-side connection terminal is much thinner than 4.0 μm, the Cu—Sn intermetallic compound is grown up to the surface before the Ag—Sn intermetallic compound is formed, and the formation of the Ag—Sn intermetallic compound is prevented, so that an increase in the contact resistance cannot be suppressed. In addition, if Ag exists in the Sn-based solder, the oxide Sn film on the board-side surface is likely to be broken at the contact interface between the board-side connection terminal and the connector terminal, and thus, there is an effect in that the Ag diffusion from the connector side into the board side easily occurs. Therefore, it is easy to maintain low resistance for a long period of time when Ag is contained in the Sn-based solder, and as the Ag content is increased, low resistance can be maintained for a longer period of time.

According to a structure where a first metal layer selected from a group including Ag, Pd and Pt on the connector terminal side and a second metal layer made of a metal selected from a group including Ag, Pd, Pt, and Au and Sn as the underlying layer are formed on a surface, even if a connector terminal component is formed by pressing from a copper strip of the configuration of the metallization, the surface of a configuration of the metallization forming a contact portion of a card edge connector can maintain a state covered with no defect with the first metal layer having excellent ductility, and thus, it is possible to easily manufacture the connector terminal according to the present invention.

Advantageous Effects of Invention

As described above in detail, in the connector connection structure where the end portion of the board is inserted into the female connector to obtain electrical conduction, a structure of two layer of the first metal layer selected from a group including Ag, Pd, and Pt as the outermost surface of one connection terminal/the second metal layer made of an intermetallic compound of one or two more metals selected from a group including Ag, Au, Pd, and Pt and Sn as the underlying layer and a structure where and a structure where the other connection terminal is made of a low melting point alloy having a thickness of 4 μm or more using Sn as a main component and containing Ag on the Cu are combined, even in a case where the connection portion is under a harsh environment of high temperature and high humidity, temperature cycle, it is possible to suppress an increase in electrical resistance of the contact connection portion and it is not necessary to use the noble metal plating member as one connection terminal surfaces, so that it is possible to provide the in-vehicle electronic module with high connection reliability with low cost. In addition, it is possible to provide a connection structure of a card edge connector having long-term connection reliability even under a harsh environment.

BRIEF DESCRIPTION OF DRAWINGS

FIG. 6 is an example of a diagram illustrating a relationship between a surface material or a film thickness and reliability of a circuit board connection terminal and a connector terminal.

FIG. 7 is another example of a diagram illustrating a relationship between a surface material or a film thickness and reliability of a circuit board connection terminal and a connector terminal.

DESCRIPTION OF EMBODIMENTS

Embodiments of the present invention will be described below with reference to the drawings.

First Embodiment

In this embodiment, an example of an electronic module being installed in an engine room of a vehicle and appropriately controlling driving of an engine will be described.

Figure 1:
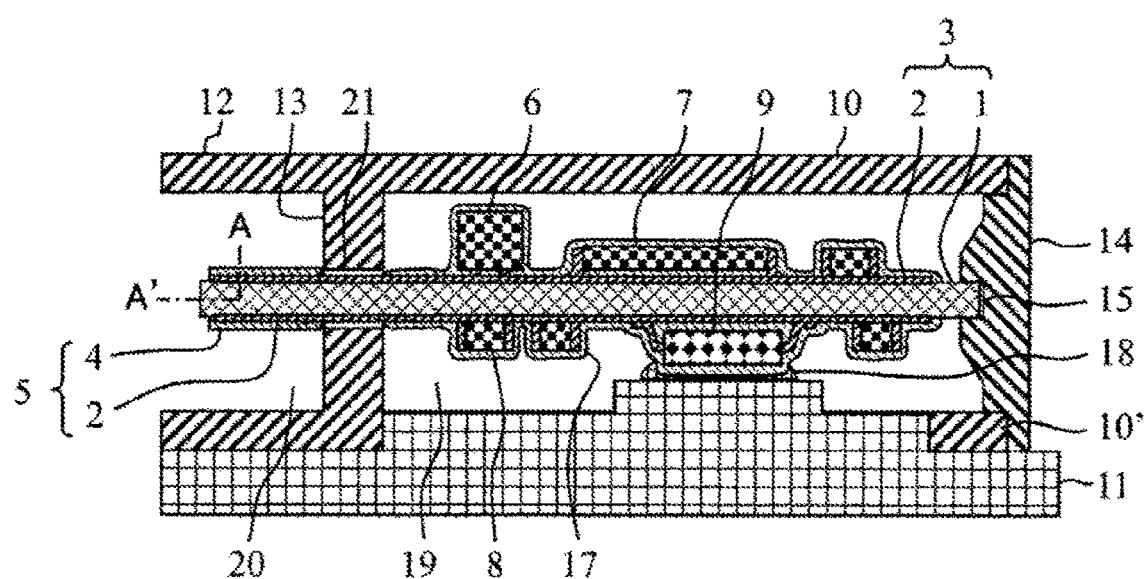
FIG. 1 is an example of a configuration diagram of an in-vehicle electronic module having a card edge connector structure.

FIG. 1 is an example of a configuration diagram of an in-vehicle electronic module having a card edge connector structure. In the figure, electronic components 6, 7, 8, and 9 are mounted on a circuit board 3 including an organic insulating board 1 and a Cu wire line 2 by soldering. On the end portion of the board, a connection terminal 5 formed by coating an Ag-containing Sn-based solder 4 on a Cu wire line 2' is formed. The Sn-based solder is supplied by dipping into a molten solder after mounting electronic components on the circuit board and forming an insulating member. Organic protection films 17 are formed on the upper and lower surfaces of an electronic component mounting region so as to cover the board and the electronic components. The organic protection film is made of a resin having moisture resistance and thermal conductivity and also having excellent heat radiation characteristics.

The electronic module case includes a metallic heat radiation member 11 of Al die casting and a resin casing 10 and a rear cover 14 for protecting the circuit board from outside air and has a connector accommodating portion 12 for accommodating and fixing the card edge connector. A connector accommodating space 20 and a circuit board accommodating space 19 is isolated from each other by a resin wall 13, and the resin wall is provided with an opening 21 for allowing the connection terminal 5 to protrude from the circuit board accommodating space to the connector accommodating space. The rear side of the circuit board is inserted and fixed in a board insertion groove 15 provided in the rear cover 14, and although not illustrated, a side surface is also fixed with a similar structure, so that resistance to mechanical vibration is improved. In addition, the electronic component 9 with large heat radiation is thermally connected to a metallic heat radiation member 11 by high thermal conductive grease 18, and thus, a heat radiation path is secured.

Figure 2:
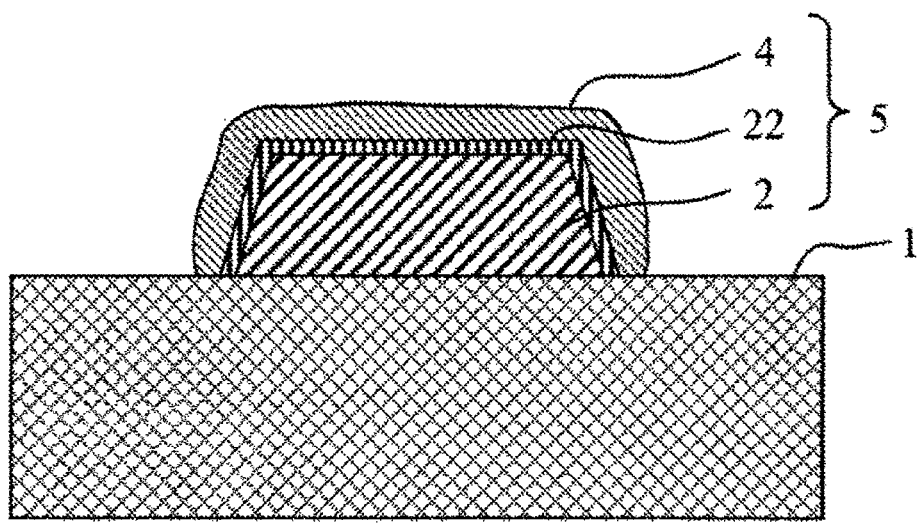
FIG. 2 is an example of a cross-sectional view of a connection terminal formed on a circuit board of an in-vehicle electronic module.

FIG. 2 illustrates an example of a cross-sectional view of the connection terminal 5. In the figure, an Sn-based solder 4 containing 3 wt % of Ag is coated on the Cu wire line 2, and a reaction layer 22 of Cu and Sn is formed at the interface. The thickness of the Sn-based solder layer is 3 to 10 μm, and the thickness of the Cu—Sn reaction layer is about 1 μm. Ag contained in the Sn-based solder varies depending on the content, but the Ag exists as an Ag—Sn intermetallic compound and is dispersed substantially evenly in the solder layer.

Figure 3:
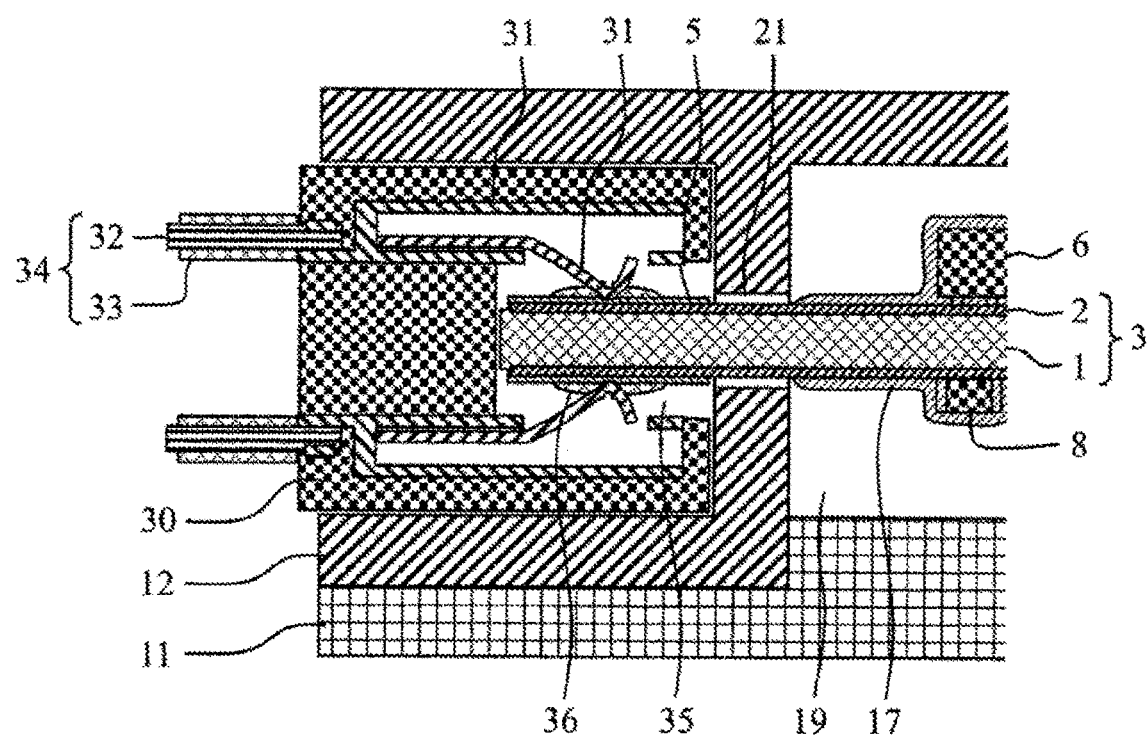
FIG. 3 is an example of a cross-sectional structural view of a connection portion between a circuit board connection terminal and a card edge connector of an in-vehicle electronic module.

FIG. 3 is an example of a cross-sectional structure of a connection portion when a card edge connector is attached to the in-vehicle electronic module of FIG. 1. In the figure, the card edge connector 30 has a plurality of pairs of connector terminals 31 having a spring characteristic, and a board insertion space 35 into which the terminal portion of the circuit board is inserted is formed. In addition, the connector terminal is connected to a wire harness 34 configured with a metal conductor 32 and an insulating covering member 33. The card edge connector is pushed into and connected to the resin wall of the connector accommodating space of the electronic module, and the connection terminal 5 pushed into the board insertion space is mechanically pressed by a force defined by the spring characteristic of the connector terminal, so that electrical conduction is secured. The contact portion between the connection terminal and the connector terminal is protectively coated with a liquid oil 36 which is thermally and chemically stable.

Herein, as the liquid oil, perfluoropolyether (PFPE) with a relatively high viscosity which is a fluorine-based oil is used.

Figure 4:
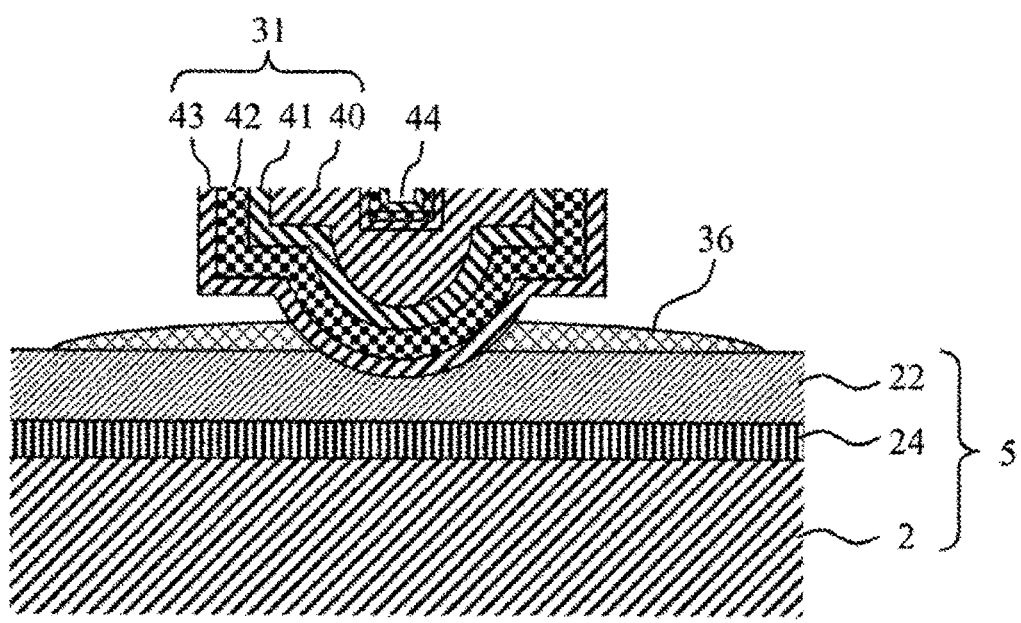
FIG. 4 is an example of a cross-sectional view of a contact connection portion between a connection terminal and a connector terminal of a circuit board.

FIG. 4 illustrates an example of a cross-sectional structure of the contact connection portion between the connector terminal and the connection terminal. In the figure, the connector terminal 31 has a configuration where an Ag—Sn compound layer 42 is formed on a Cu alloy core 40 excellent in spring characteristic and conductivity via an Ni barrier layer 41, and an Ag layer 43 is formed thereon. With respect to the manufacturing of the connector terminal, a plating treatment of an Ni plating film with 1 μm/an Sn plating film with 0.2 μm/an Ag plating film with 1 μm is performed in the state of a copper strip, and a heat treatment is performed to react the Sn layer with Ag to form an Ag—Sn compound layer. Next, the connector terminal is molded and manufactured by a press cutting process. The contact portion of the connector terminal is formed by pressing from the back side and extruding into a convex shape. Since the Ag-containing Sn-based solder layer of the connection terminal 5 is configured as a soft thick film, a structure is adopted where depression and contact occurs from the time when the connector terminal is pressed. A behavior of change exhibits that the depression increases with time due to creep deformation, and the contact area increases. At the contact interface of the connection terminal, soft Sn-based solder and soft Ag film are in close contact with each other. The liquid oil 36 which is a protective coating agent serves as a lubricant in the process of inserting the end portion of the board into the connector, so that the liquid oil has a function of enhancing the sliding of both metal surfaces to reduce the abrasion of the surface and reducing the insertion force of the board. During the period of use of the electronic module, a coating film is formed with the surface tension of oil that fills a gap at the contact interface and covers the metal surface in the vicinity of the interface, so that the state is formed where the contact interface is isolated from moisture of the outside air and the atmosphere. Since the liquid oil does not affect the contact pressure of the connector terminal, the liquid oil does not affect the metal contact state between the connector terminal and the connection terminal.

According to the present embodiment, the outermost surface of the connector terminal of a Cu alloy is made of soft Ag, the underlying layer is made of a hard Ag—Sn intermetallic compound, and the underlying barrier layer is made of Ni, so that the connection terminal of the circuit board is configured to have such a structure that a thick Ag-containing Sn-based solder is formed in the Cu wire line. In addition, a fluorine-based liquid oil is applied to a contact interface, and thus, even in a case where a compact, light-weighted card edge connector type electronic module is installed in a place exposed to a harsh environment such as an engine room, it is possible to secure high connection reliability for a long period of time. As a result, it is possible to reduce the cost of the highly reliable card edge connector type electronic module.

Meanwhile, although the noble metal Ag is used for the card edge connector, the material is inexpensive compared with Au, and the required metallization process can be performed in the state of a copper strip, so that the process cost is unchanged compared with the process cost in the related art, and an increase in cost of the connector with high reliability can be suppressed low. In addition, since the contact portion is coated with a chemically stable fluorine-based oil, and the terminal surface to be connected is configured as a combination of soft Ag and the Sn-based solder, it is possible to reduce an insertion/extraction force of the board during attaching the connector or to reduce abrasion damage during sliding, and the effect of blocking the contact portion from moisture and air is added, so that it is possible to greatly improve the resistance to high temperature, high humidity temperature cycle, and mechanical vibration of the connector connection portion for a long period of time.

Figure 5:
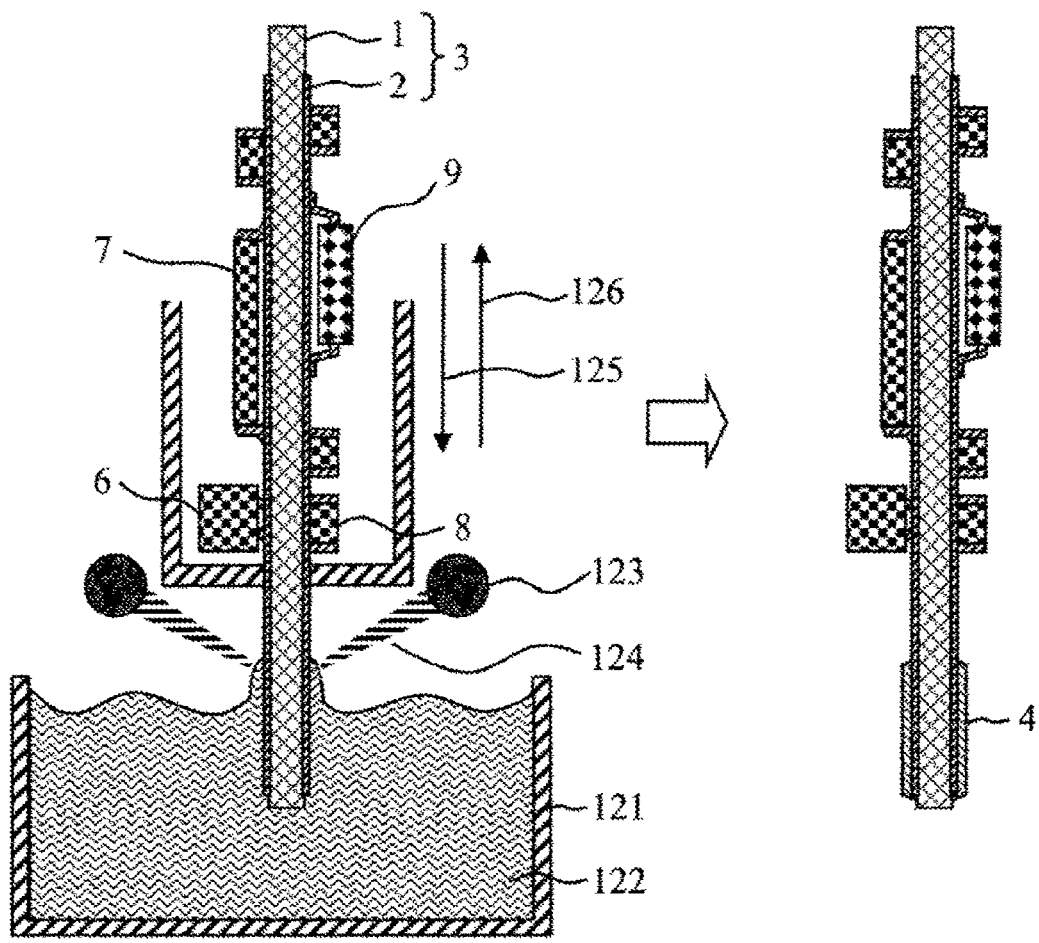
FIG. 5 is an example of a method of forming a connection terminal on a Cu wire line at an end of a circuit board.

FIG. 5 illustrates an example of a method of forming the connection terminal 5 at the end portion of the circuit board of FIG. 1. In the figure, electronic components 6, 7, 8, and 9 are mounted on the circuit board 3. The formation region of the connection terminal 4 at the end portion of the circuit board is immersed in the molten solder 122 in the solder bath 121 for a short period of time to wet the solder to the Cu wire line 2 and pull the solder up. A leveling brush 123 for blowing away molten solder excessively adhered by the air knife 124 is disposed in the pulling up portion, and the thickness of the solder to be adhered is adjusted.

According to the present embodiment, with respect to a circuit board on which electronic components are mounted, it is possible to form a thick solder layer in a connection terminal portion with good mass productivity without having a large thermal influence on an mounting region and without using expensive facilities, so that it is possible to manufacture a circuit board with a board terminal for connecting a card edge connector at low cost. The thickness of the solder layer can be controlled by adjusting the gap between the leveling brush and the circuit board and the air pressure.

Second Embodiment

In this embodiment, an example of the reliability evaluation result in a case where the surface material or the film thickness of the connector terminal and the board-side connection terminal is changed will be described.

FIG. 6 lists reliability evaluation results obtained in the combinational cases where the first layer of the outermost surface of the connector terminal is made of Ag, the second layer as the underlying layer is configured with an Ag—Sn compound layer, the low melting point alloy formed on the Cu wire line of the connection terminal is changed, and the film thicknesses of the metallization layers are changed. For the connection reliability evaluation, after high temperature exposure at 150° C. is performed for 1500 h, temperature cycle test of −40° C./125° C. is performed 2000 cycles, and such a sample having a contact resistance of 10 mΩ or less is determined as acceptable "○".

From the figure, even if the thickness of the Ag/Ag—Sn layer on the surface of the connector terminal is as thick as 2 μm and the thickness of the solder on the surface of the board-side connection terminal is as thick as 6 μm, in the case of the Sn—Zn or Sn—Cu solder of which material does not contain Ag, the connection reliability is not obtained. In a case where the surface of the board-side connection terminal is made of an Ag-containing Sn-based solder, in a case where the thickness of the Ag/Ag—Sn layer of the connector terminal is as thin as 0.2 μm, even if the thickness of the board-side solder layer is as thick as 4 μm, the required reliability is not obtained. In the case of a low Ag solder, in a case where the thickness of the solder is 2 μm or less, even if the thickness of the Ag/Ag—Sn layer of the connector terminal is as thick as 2 μm, the required reliability is not obtained. The required reliability is obtained when the thickness of the Ag/Ag—Sn layer of the connector terminal is 1 μm or more and the thickness of the Ag-containing Sn-based solder is 4 μm or more.

However, if the Ag content of the Sn-based solder is as high as 20%, the required reliability is obtained even when the thickness of the solder is as thin as 2 μm. However, since the liquid temperature of the solder is increased, the coating by immersion into the solder bath becomes difficult, and thus, there is a problem that the process cost increases.

FIG. 7 illustrates evaluation results of connection reliability corresponding to the film thickness of the Ag- and Sn-based solder when the first/second layer is made of Ag/Ni as the surface material of the connector terminal, and an Ag-containing Sn-based solder is used as the surface material of the one board-side connection terminal.

For comparison, the results of a case where Ag/Ag and Au/Au are used for the connection terminals of the connector and the board are also illustrated in the same figure. In addition, the board cost at this time is also evaluated. Similarly to the case of Ag/Ag—Sn, in a case where the surface material of the connector terminal is Ag/Ni, if the Ag layer is thinner than 1.0 μm, the connection reliability is insufficient; and if the thickness of the Sn-based solder of the board-side connection terminal is thinner than 4 μm, the connection reliability is insufficient.

The required reliability is required when the Ag of the connector terminal is 1.0 μm or more and the thickness of the Sn-based solder of the board-side connection terminal is 4 μm or more. In addition, in a case where the terminal material of the connector/board is Ag/Ag or Au/Au, high reliability is obtained even if the surface metallization on the connector side or the board side is thin, but the cost of the board is high, and thus, this case is not practical.

According to the present embodiment, the surface material of the connector terminal is configured with an Ag/Ag—Sn layer or an Ag/Ni layer, the thickness of the layer containing Ag is set to be 1 μm or more, and the surface material of the board-side connection terminal is made of an Ag-containing Sn-based solder having a thickness of 4 μm or more, so that it can be seen that results of satisfactory connection reliability in both of the case of high-temperature exposure and the case of temperature cycling, and the products are within a practical range in terms of cost.

In the embodiments illustrated in FIG. 6 and FIG. 7, a noble metal Ag is used for the surface material on the connector terminal side, and an Ag-containing Sn-based solder is used for the surface material of the board-side connection terminal. However, even if the materials of the connection terminals of the connector side and the board side are exchanged, the same connection reliability result can be obtained, and thus, the combination causes no technical problems. However, in order to configure the surface of the board-side connection terminal to be a noble metal Ag, such a special process of applying partial selective plating to a plurality of boards or individual boards is required, so that there is a problem of cost increase.

In addition, in the embodiments of FIGS. 6 and 7, the surface material of the connector terminal is illustrated by a noble metal Ag, but Pd or Pt which does not grow brittle intermetallic compound with Sn in a low temperature region of 160° C. or less may be used so as to obtain the same effect as Ag.

Third Embodiment

In this embodiment, an example of a resin mold type in-vehicle electronic module in which a mounting region of a circuit board is sealed with a thermosetting resin will be described.

Figure 9:
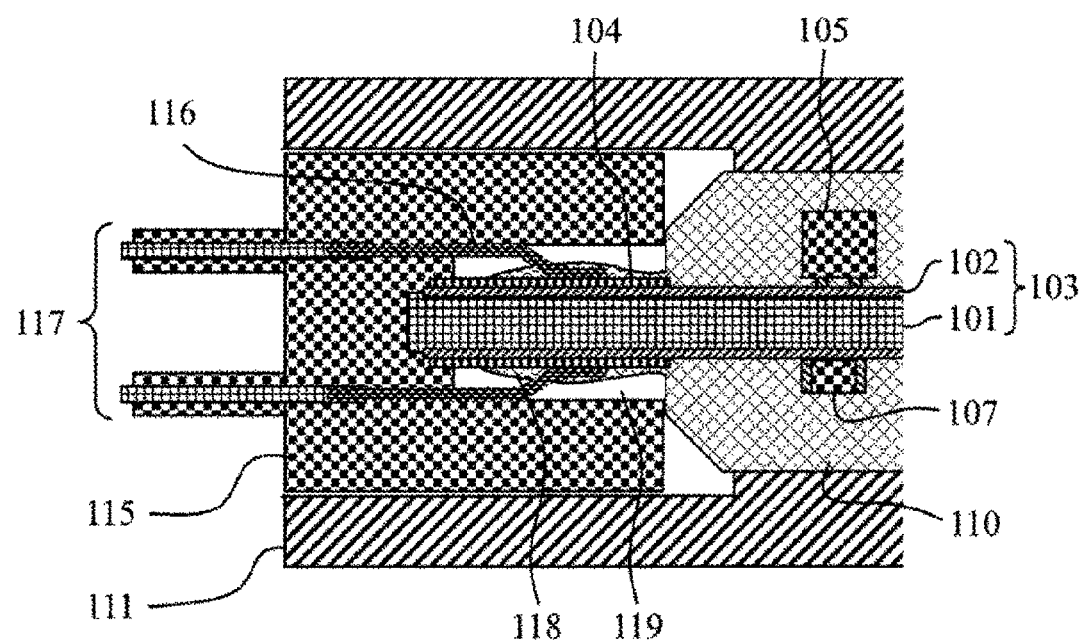
FIG. 9 is an example of a cross-sectional structural view of a connection portion between a circuit board connection terminal and a card edge connector of a resin-molded type in-vehicle electronic module.

FIG. 9 is an example of a cross-sectional structure of an in-vehicle electronic module in which a sleeve member for accommodating a card edge connector is assembled in a resin-molded electronic module. In the figure, electronic components 105, 106, 107, and 108 are mounted on a circuit board 103 configured with an organic insulating board 101 and a Cu wire line 102 by soldering, and a high heat conducting member 109 is fixed to an electronic component 108 which generates a large amount of heat. The mounting region of the circuit board is molded with a thermosetting sealing resin 110 covering all the electronic components on both the front and back surfaces. On the end portion of the board exposed to the mold resin, a connection terminal 104 is formed by dip-coating Ag-containing Sn-based solder with an average thickness of 6 μm on the Cu wire line. A connector accommodating sleeve member 111 having a function of accommodating and fixing the card edge connector is integrally formed with the molding resin so as to cover the end portion of the board. The connector accommodating sleeve member is manufactured by forming a mold•connection terminal, and after that, by injection molding of a thermoplastic resin. Reference numeral 112 denotes a connector accommodating space.

Figure 8:
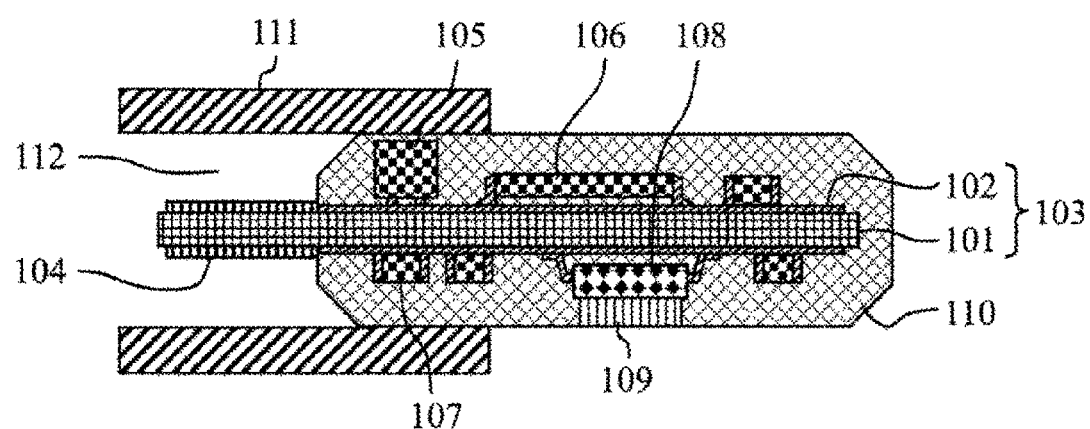
FIG. 8 is an example of a configuration diagram of a resin-molded type in-vehicle electronic module having a card edge connector structure.

FIG. 9 is an example of a cross-sectional structure of the connection portion when the card edge connector is attached to the in-vehicle electronic module of FIG. 8. In the figure, the card edge connector 115 has a plurality of pairs of connector terminals 116 having a spring characteristic, and a board insertion space 119 into which the terminal portion of the circuit board is inserted is formed. In addition, the connector terminal is connected to a wire harness 117 configured with a metal conductor and an insulating covering material. The surface layer of the connector terminal has a multi-layer structure where the uppermost surface is Ag, an Ag—Sn layer is formed as the underlying layer, and an Ni layer is formed as the underlying layer.

The card edge connector is pushed into and connected to the connector accommodating space formed by the connector accommodating sleeve member of the electronic module, and the connection terminal 104 at the end portion of the board pushed into the board insertion space is mechanically pressed by a force defined by the spring characteristic of the connector terminal, so that electrical conduction is secured. The contact portion between the connection terminal and the connector terminal is protectively coated with a liquid oil 118 which is thermally and chemically stable According to the present embodiment, a circuit board of an electronic module is molded with a thermosetting sealing resin, the horizontal size to be molded is set to be slightly larger than the size of the circuit board excluding a connection terminal formation region at the end of the circuit board, and the height of the mold is set to be slightly higher than the height of the electronic component mounting height, so that a casing member for protecting the circuit board becomes unnecessary, and the size of the electronic module main body can be greatly reduced.

In addition, a solder joint portion of the electronic component is fixed by a contraction force of the sealing resin, and thus, the solder joint portion is in a state where compression stress is applied. Therefore, thermal fatigue life time of the solder joint portion is greatly improved, so that it is possible to provide an in-vehicle electronic module with high reliability of a circuit board mounting portion At the same time, similarly to the first embodiment, it is possible to provide an in-vehicle electronic module having a connector connection structure with high connection reliability of a card edge connector, a connector and a connection structure.

REFERENCE SIGNS LIST 1 organic insulating board
2 Cu wire line
3 circuit board
4 Ag-containing Sn-based solder
5 connection terminal
9 electronic component
10 resin casing
11 metallic heat radiation member
30 card edge connector
31 connector terminal

The invention claimed is:

1. An in-vehicle electronic module comprising:
a circuit board on which an electronic component is mounted; and
a protection member accommodating the circuit board,
wherein the circuit board has an end portion protruding into an external space from the protection member,
the end portion of the board comprises a connection terminal on a surface thereof for being inserted into an external female connector to obtain electrical conduction, and
the connection terminal comprising a Cu wire line, a solder layer having Sn as a main component and comprising an Ag—Sn intermetallic compound disposed above the Cu wire line, and a Cu—Sn reaction layer disposed between the Cu wire line and the solder layer.

2. The in-vehicle electronic module according to claim 1, wherein the solder layer has an average thickness of 4 micrometers (μm) or more.

3. The in-vehicle electronic module according to claim 1, wherein the Ag—Sn intermetallic compound has a grain size of 1 μm or more.

* * * * *